United States Patent

Matsunaga et al.

(10) Patent No.: US 8,229,711 B2
(45) Date of Patent: *Jul. 24, 2012

(54) METHOD OF ANALYSIS FOR KINETIC PROPERTIES OF GOLF CLUB HEAD AND GOLF CLUB THEREFOR

(75) Inventors: Hideo Matsunaga, Chichibu (JP); Kozue Wada, Chichibu (JP)

(73) Assignee: Bridgestone Sports Co., Ltd., Tokyo (JP)

(*) Notice: Subject to any disclaimer, the term of this patent is extended or adjusted under 35 U.S.C. 154(b) by 827 days.

This patent is subject to a terminal disclaimer.

(21) Appl. No.: 12/342,114

(22) Filed: Dec. 23, 2008

(65) Prior Publication Data

US 2010/0160072 A1    Jun. 24, 2010

(51) Int. Cl.
  *G06F 17/50* (2006.01)
  *G06F 7/60* (2006.01)
  *G06F 17/10* (2006.01)
  *G06G 7/48* (2006.01)
  *A63B 53/00* (2006.01)

(52) U.S. Cl. ............ 703/1; 703/2; 703/6; 473/324; 473/325

(58) Field of Classification Search .......... 703/1, 2, 703/6; 473/324–325
See application file for complete search history.

(56) References Cited

U.S. PATENT DOCUMENTS

| | | | | |
|---|---|---|---|---|
| 5,488,692 A * | 1/1996 | Karasick et al. | | 345/420 |
| 5,731,817 A * | 3/1998 | Hahs et al. | | 345/423 |
| 5,877,970 A * | 3/1999 | Nesbit et al. | | 703/1 |
| 6,572,492 B2 * | 6/2003 | Tinsman | | 473/353 |
| 6,648,769 B2 * | 11/2003 | Lee et al. | | 473/223 |
| 6,876,956 B1 * | 4/2005 | Cirak et al. | | 703/2 |
| 6,983,637 B2 * | 1/2006 | Nesbit et al. | | 73/12.02 |
| 7,062,082 B2 * | 6/2006 | Miki et al. | | 382/154 |
| 7,223,179 B2 | 5/2007 | Tsunoda | | |
| 7,241,230 B2 * | 7/2007 | Tsunoda | | 473/324 |
| 7,454,948 B2 * | 11/2008 | Tsunoda | | 73/9 |

(Continued)

FOREIGN PATENT DOCUMENTS

JP    2005-006763 A    1/2005

(Continued)

OTHER PUBLICATIONS

Wang et al., Modal Properties of Golf Club Wood Driver in Different Boundary Conditions, 2005, National Pingtung University of Science and Technology.*

(Continued)

*Primary Examiner* — Dwin M Craig
*Assistant Examiner* — Aniss Chad
(74) *Attorney, Agent, or Firm* — Sughrue Mion, PLLC

(57) ABSTRACT

The accuracy or computation speed of analysis of a club head using the finite element method is improved. In a method of analysis of a golf club head, a model of the golf club head represented by a set of elements including tetrahedral solid elements 30 is prepared on a computer, nodes 32 are provided at the vertexes and on at least one side of the tetrahedral solid element, and the kinetic properties of the golf club head are computed by the finite element method in which the elements and nodes of the model are used and the nodes are made output points of computation. At this time, in at least some of the tetrahedral solid elements, the number of nodes provided per one element is made not fewer than ten.

10 Claims, 4 Drawing Sheets

U.S. PATENT DOCUMENTS

| | | | |
|---|---|---|---|
| 7,494,426 B2 * | 2/2009 | Nishio et al. | 473/350 |
| 2004/0162157 A1 * | 8/2004 | Naito et al. | 473/324 |
| 2004/0162158 A1 * | 8/2004 | Tsunoda | 473/324 |
| 2006/0160637 A1 * | 7/2006 | Matsunaga | 473/324 |
| 2007/0015601 A1 | 1/2007 | Tsunoda et al. | |
| 2009/0240479 A1 * | 9/2009 | Matsunaga et al. | 703/2 |

FOREIGN PATENT DOCUMENTS

| | | |
|---|---|---|
| JP | 2005-065996 A | 3/2005 |
| JP | 2006-023955 A | 1/2006 |
| JP | 2006-031430 A | 2/2006 |

OTHER PUBLICATIONS

Friswell et al., Updating Finite Element Models of Golf Clubs, 1997, In: Proceedings of the International Modal Analysis Conference (IMAC) Feb. 3-6, 1997, pp. 155-161.*

Hocknell et al., Hollow golf club head modal characteristics: Determination and impact applications, 1998, Experimental Mechanics, vol. 38, No. 2, pp. 140-146.*

* cited by examiner

FIG.4A(1)
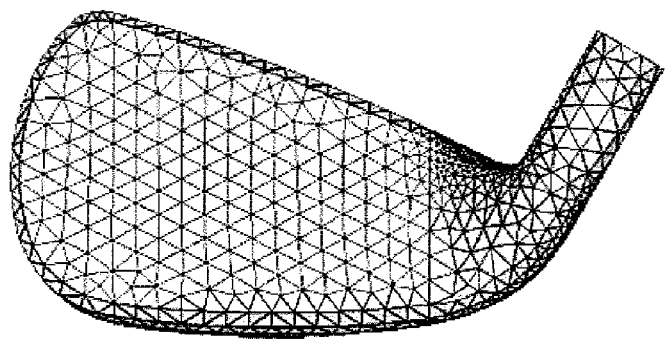
FIG.4A(2)
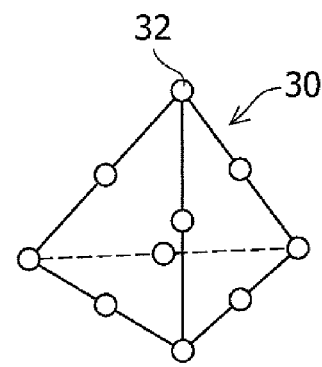
FIG.4B(1)
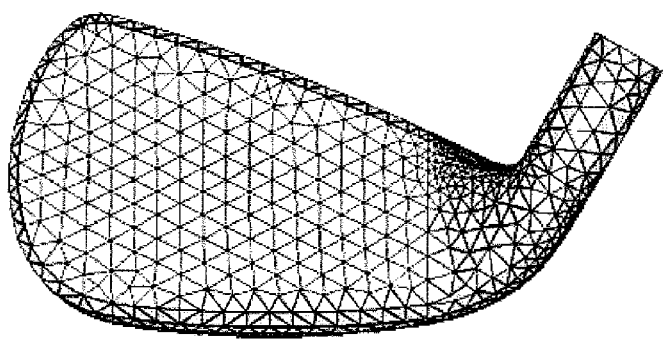
FIG.4B(2)
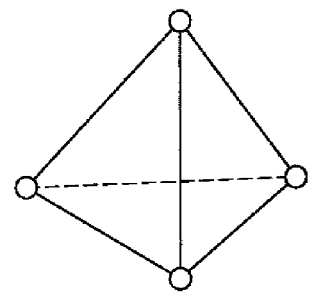
FIG.4C(1)
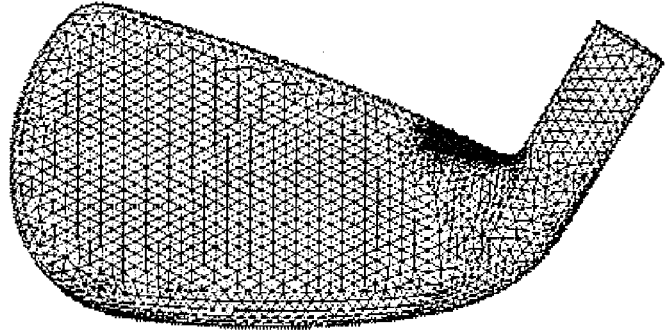
FIG.4C(2)
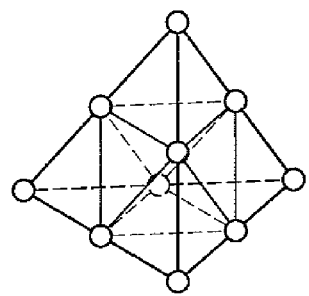

FIG.6
FIRST-ORDER MODE
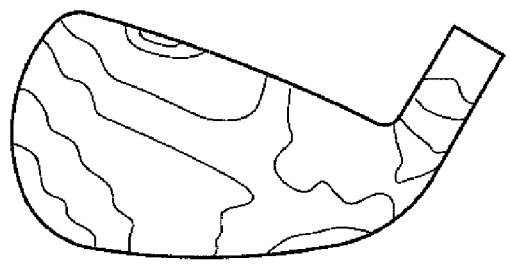
SECOND-ORDER MODE
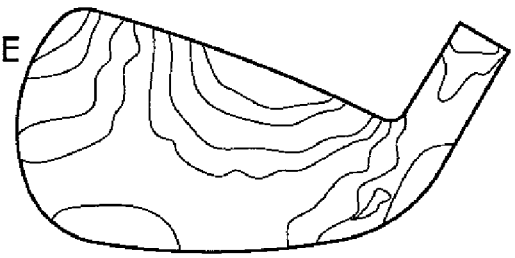
THIRD-ORDER MODE
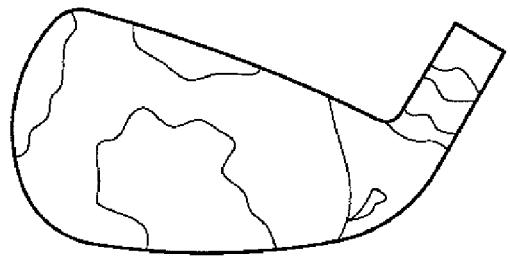
FOURTH-ORDER MODE
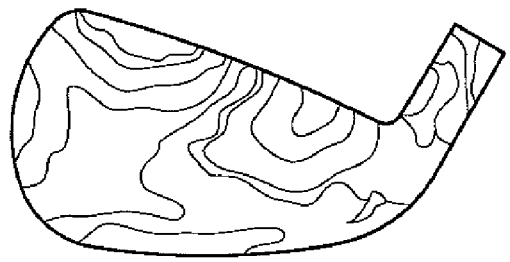

METHOD OF ANALYSIS FOR KINETIC PROPERTIES OF GOLF CLUB HEAD AND GOLF CLUB THEREFOR

BACKGROUND OF THE INVENTION

The present invention relates to a method of analysis of kinetic properties of a golf club head, and relates to a golf club having the golf club head. More particularly, the present invention relates to a method of analysis for simulating properties involving deformation of a golf club head, the method being carried out by using a finite element method using a model produced on a computer.

The finite element method has been known as a computation method for analyzing properties of an object with an intricate shape on a computer by dividing the object into a plurality of elements, and by evaluating some physical quantities in each element. The finite element method has an advantage that, when structural design is made with this method, the user can understand phenomena occurring on the object even if he/she does not necessarily have an advanced knowledge on material mechanics or elastodynamics. Therefore, the finite element method is widely used to analyze various structures and articles.

In the finite element method, processing is performed to generate the collection of elements beforehand, depending on the phenomenon or physical quantity to be evaluated or on the structure of the object. The mode of this generation of elements is often called mesh sectioning, and this is known as a factor that may significantly influence affecting the computation accuracy of the finite element method.

On the other hand, an object having an intricate three-dimensional shape, such as a golf club head (hereinafter referred to as a "club head"), is also analyzed with the finite element method at the design stage to select the material thereof or to determine the construction thereof for the purpose of appropriately designing a club head in which, for example, resilience performance, feeling of hitting, and sound of hitting are balanced.

As one ideal model of elements to analyze the kinetic properties of an object by using the finite element method, there is used a model in which each of all of the elements is formed by a small cube. Such a model is especially suitable for the analysis of a solid club head such as an iron and a putter. However, it is difficult to analyze the kinetic properties of a club head only by such cubic solid elements. The reason for this is that, since the shape of the club head is intricate, difficulties arise in dividing a modeled club head into elements for providing all solid elements contained therein by cubes.

SUMMARY OF THE INVENTION

To solve the above problem, it is desired to prepare a club head model in which physical properties that approximate the actual club head as closely as possible can be obtained in parts of the club head represented by solid elements, and the computation accuracy is improved even for an intricate shape prone to have a high aspect ratio of a solid element, while suppressing significant increase in the computation time.

It has been revealed that a model meeting three conditions described below is desirable for the finite element analysis of a club head using solid elements.

Firstly, for the intricate shape of a club head, a tetrahedral element is more suitable for representing fine irregularities than a hexahedral element. Therefore, it is desirable that the largest possible number of elements be formed by tetrahedrons, and further, that a model in which no hexahedral element exist be used. FIG. 1 shows an example of a tetrahedral element. If a hexahedral element is present in a model having many tetrahedral elements, the approximation with respect to stress in the hexahedral element is different from that on the triangular face of the other element. Such a difference in the approximation deteriorates the computation accuracy as a whole.

Secondly, it is desirable that the aspect ratio of each element be close to 1:1, that is, the surface shape of each element be close to a regular triangle. The aspect ratio is defined as a ratio of the length of the longest side to the length of the shortest side of all sides constituting an element. For an element having a high aspect ratio, the approximation accuracy in the direction of the long side decreases. Combining the first condition with the second condition, an element as close as possible to a regular tetrahedron is preferable.

Thirdly, it is desirable that the mesh be made fine, that is, that the number of elements be increased. As the mesh is made finer and more elements are used, the computation accuracy improves. In the conventional art, however, if the model is sectioned to a fine mesh, the number of elements increases, which leads to a problem in that the computation time increases, and in some cases, the computation cannot be performed. Therefore, as the third condition, from the viewpoint of taking account of practicability considering computation time as well, it is demanded to prepare a model capable of achieving both of high computation accuracy and high computation speed, that is, a model in which the accuracy is improved without increasing the number of elements.

These conditions will be explained in more detail from the viewpoint of problems occurring when they are applied to a club head. The first condition poses a problem typically in the case of a model in which a hexahedral element is present. Also, in the second condition, since the shape of the club head is intricate, difficulties arise in making all elements of a simulated model regular tetrahedrons and in making the elements have a uniform size in the region in which the club head is approximated. Furthermore, the third condition becomes tangible as a problem in that the fineness of mesh (that is, the number of elements) cannot be set so that both of high computation accuracy and high computation speed are achieved.

An object of one aspect of the present invention is to ease designing or refining of a design for improving the performance of a club head by achieving both high computation speed and high computation accuracy by partially meeting the above-described conditions and by solving at least one of the problems.

The present invention provides a method of analysis for the kinetic properties of a golf club head, including the steps of preparing a model of a golf club head represented by a set of elements including a tetrahedral solid element on a computer; providing nodes at the vertexes and on at least one side of the tetrahedral solid element; and computing the kinetic properties of the golf club head by the finite element method in which the elements and nodes of the model are used and the nodes are set as output points of computation, wherein, in at least some of the tetrahedral solid elements, the number of nodes provided per one element is not fewer than ten.

By using the method of analysis in accordance with the present invention, an appropriate model for simulating the club head is obtained, so that the kinetic properties of the club head produced as a model can be analyzed appropriately by the finite element method. Thereby, the computation accuracy at the time when the kinetic properties of the club head are analyzed using the finite element method can be enhanced, or the computation speed can be increased while the same computation accuracy is maintained. As the result, for example, the selection of material or construction for increasing the carry can be made rapidly. Thereby, a high-performance club head can be analyzed or designed easily.

DESCRIPTION OF THE PREFERRED EMBODIMENTS

An embodiment of the present invention will now be described with reference to the accompanying drawings. In the present invention, as one example, vibration mode analysis is conducted to study vibrations occurring when a golf ball is hit by a club head by means of simulation on a computer, in which simulation the vibrations are decomposed into a set of natural vibration modes. Thereby, when the structural design of club head is carried out to determine the shape and material of club head, the thicknesses of parts of club head, and the like, analysis can be carried out to predict the kinetic properties of the club head, without doing an experiment based on an actually produced club head or by omitting the process of such an experiment in the analysis. The physical quantity or physical properties evaluated in the analysis of kinetic properties of the club head cover macroscopic properties of the club head including deformation, dynamic properties of the club head, such as natural frequency, initial speed, delivery angle, and spin, and microscopic properties including strain and stress in each part of the club head. These kinetic properties to be analyzed also include a static behavior in which time dependence is not important and a dynamic behavior in which time dependence is important. Also, the method of analysis in accordance with the present invention includes batch processing in which a set of parameters is assumed, with which the material and construction conditions for simulating the kinetic properties are changed continuously or sequentially for evaluation, optimization processing in which the optimum values for the parameters are determined wherein the kinetic properties are evaluated directly or by any evaluation function, and the like processing.

FIG. 2 is a flowchart showing an analysis method 10 in accordance with one aspect of the present invention. When the processing is started, in a preprocessor, preparation such as generation of a club head model to be computed is made (Step 12). The details will be described later of the sort of model generated by which method at this time. Next, on the generated model, the kinetic properties shown by the model are computed by using a solver for primarily performing matrix computation (Step 14). The computation at this time is performed by the finite element method. Then the processing for evaluating the computed kinetic properties and visualizing the computation result is performed by using a postprocessor (Step 16). If the evaluator intends to change, for example, the material of the club head or to change the conditions such as the construction as a result of evaluation using the postprocessor, accordingly a refined model may be generated again by the preprocessor, or refined conditions may be set. The refined model may involve a change in coordinates of elements due to the change in thicknesses of parts, and the refined condition includes a change in conditions such as a change in material. In such an analysis method, since the analysis using the finite element method is conducted by the generation of model, the model being prepared significantly influences the subsequent behavior of the computed club head model, and consequently, it influences the accuracy and speed of the overall computation. Next, the features of the finite element method model of the club head used in the analysis method in accordance with the present invention will be described.

The model on a computer is represented and defined by a sequence of data recorded on any recording medium, the sequence of data itself being capable of being read by the computer. The computation of the finite element method is made by using this sequence of data representing the model, and the simulation is carried out with respect to the kinetic properties of the club head to be analyzed. The sequence of data defining the model includes, of all the data necessary for the computation, at least node position data capable of defining each element, and any form of data relating to the connection from which the connection among nodes can be reproduced. The sequence of data optionally includes data relating to material wherein the data embodies the material properties of each element, and, in some cases, includes other supplementary data. The elements and the nodes are defined by such data. The model used in the analysis method in accordance with the present invention will be described below by way of an example of a three-dimensional spatial arrangement.

FIG. 3 is an explanatory view showing the arrangement of nodes 32 in each element 30 of a model used in an embodiment of the present invention. As the element, a solid element having a tetrahedral shape is arranged. As shown in FIG. 3, each of the tetrahedral elements is provided with ten nodes 32. According to the conventional art, in the case in which an ordinary tetrahedral element is used, nodes are arranged only at four vertexes of the tetrahedral element. In contrast, in the embodiment of the present invention, nodes are additionally arranged at the midpoints of sides in addition to these vertexes, whereby ten nodes 32 are used in total.

On the solid element shown in FIG. 3, there exist four vertexes A to D. Now, the arrangement of nodes will be described in detail. A tetrahedron ABCD has sides (edges) AB, BC, CA, AD, BD and CD as edge lines. On these sides, midpoints $M_{AB}$, $M_{BC}$, $M_{CA}$, $M_{AD}$, $M_{BD}$ and $M_{CD}$ are provided. The nodes are provided not only at the four vertexes of A to D but also at the midpoints $M_{AB}$, $M_{BC}$, $M_{CA}$, $M_{AD}$, $M_{BD}$ and $M_{CD}$.

The aspect ratio used in the present invention is determined for an element at the stage in which the mesh or elements have been prepared. In this regard, the aspect ratio of an element is defined as a value obtained by dividing the length of the longest side by the length of the shortest side of all sides of that element. Applying this definition to the element 30 shown in FIG. 3, the aspect ratio is calculated by dividing the length of the longest side of the sides AB, BC, CA, AD, BD and CD by the length of the shortest side thereof.

Generation of Mesh

The solid element is an element capable of simulating the solid part of an object appropriately, and the computation accuracy thereof is high. In particular, under conditions in which it is desirable to consider the elasticity and viscosity of the material of a club head, a sufficiently high computation accuracy can be achieved. As an example of such a condition, a club having less hollow parts, such as an iron, can be cited. In the case in which the thickness need not be particularly changed, the solid element is effective because it can minutely specify various parameters.

As described above, the model is prepared by using the preprocessor (FIG. 2, Step 12). The specific means for preparing such a model will be described in more detail. In the embodiment of the present invention, as one example, after a shape for obtaining each element has been defined by using 3D-CAD, the preprocessor is used. Specifically, in the case of this example, first, the geometries for a shape representing a club head and for a region of each element in each mesh are defined by using 3D-CAD. Thereafter, a mesh is generated from the geometries by using the preprocessor.

Provision of Nodes

Next, the nodes are provided at the vertexes and at the midpoints between adjacent two vertexes. The adjacent two vertexes are adjacent two vertexes belonging to a common edge. That is, whether the two vertexes are adjacent or not is not judged by the distance between the two vertexes. The data of conditions for specifying the node may be obtained by receiving the user's selection beforehand. Therefore, at the stage in which the model is sectioned into a mesh by the preprocessor, the condition can be defined so that the ten nodes in each element are set automatically.

Provision of Material Parameter

Then, material parameters are given to each element. Depending on the nature of the club head to be simulated, parameters (physical property data) necessary for simulation, such as a parameter for specifying elasticity and viscosity (collectively, referred to as physical properties), are given to each element. In the case in which the objective of simulation is to determine a change in kinetic properties due to the material by changing the material only in the simulation, while maintaining the dimensions of a sole, face, back face, and the like, the generation of a mesh and the provision of nodes are accomplished in advance, and operation can be performed so that only the material parameters are selected successively in ranges of predetermined values. By the above-described processing, in the present invention, the solver (Step 14) can generate data for the use in computation.

Embodiment 1

In one embodiment of the present invention, a model is prepared by using tetrahedrons for all the elements. At this time, if the aspect ratio of an element is not lower than 1.0 and not higher than about 8.0, a satisfactory analysis can be made. Also, if the aspect ratio of element in the face region of club head is not lower than 1.0 and not higher than about 1.5, preferably not lower than 1.0 and not higher than about 1.35, a satisfactory analysis can be made. Furthermore, if each of the aspect ratios of the shapes of all elements are not lower than 1.0 and not higher than about 4.5, a satisfactory analysis can be made.

Embodiment 2

As an embodiment of the present invention, a shell element can be used additionally. The shell element is an element having a shell shape that has two opposed faces of polygons (usually, triangles or quadrangles) and also has a thickness. For example, when a plate-shaped member having physical properties different from those of other parts is used for the face of an iron, such a plate-shaped member is sometimes reproduced with high accuracy by the shell elements.

Embodiment 3

Also, the condition of being capable of making a satisfactory analysis can also be specified by a volume ratio, not by the aspect ratio. That is to say, if the volume ratio, which is a ratio of the maximum volume of an element to the minimum volume thereof in the face region, is not lower than 1 and not higher than 10, a satisfactory analysis can be made. If the volume ratio is preferably not lower than 1 and not higher than 8, a more satisfactory analysis can be made.

Embodiment 4

In an embodiment of the present invention, each of the elements can be provided with ten nodes at the vertexes and the midpoints of sides in total. Since the number of nodes in the model indicates the number of output points of the finite element method, in this embodiment, the number of output points is increased, which achieves improved computation accuracy. To verify this, analysis was made by making the number of nodes provided in the tetrahedral solid element four and ten, and the analysis results obtained therefrom were compared. As a result, in the case in which the number of nodes of the tetrahedral solid element was made four, sufficient computation accuracy was not obtained. In contrast, in the case in which the nodes were provided at the midpoints of sides, and the number of nodes was made ten, analysis was made with satisfactory computation accuracy.

Computation Example

As a computation example relating to the above-described embodiments of the present invention, computation was performed by using a mesh generating method, in which the features described in the above embodiments 1 to 4 were implemented, to simulate club head samples. In this computation example, natural frequencies (first order to ninth order) obtained by the vibration mode analysis are computed, and the computation results are compared with corresponding natural frequencies of each order of the real club head.

Three models were prepared so as to reflect the sample shape of the real iron club head. FIGS. 4A(1) to 4C(1) show the meshes of the models. FIG. 4A(1) shows an example in which the nodes are provided at the vertexes and the midpoints of the tetrahedral solid element. FIG. 4B(1) shows comparative example 1 in which the number of elements is the same as that of the example and the nodes are provided at the vertexes only. FIG. 4C(1) shows comparative example 2 in which the nodes are provided at the vertexes only and the number of elements is increased. Corresponding to these figures, 4A(2) to 4C(2) schematically show the feature of the elements. In these schematic views, a circle represents the node, and a minimum tetrahedron represents one element. The material parameters are given to the example, comparative example 1, and comparative example 2, and thereby vibration modes are analyzed.

The number of elements and the number of nodes generated in the example, comparative example 1, and comparative example 2 are given in Table 1

TABLE 1

|  | Example | Comparative example 1 | Comparative example 2 |
| --- | --- | --- | --- |
| Number of elements | 10828 | 10828 | 51028 |
| Number of nodes | 5260 | 2630 | 11024 |
| Max. aspect ratio (face) | 1.2 | 1.2 | 1.5 |
| Volume ratio (face) | 7.4 | 7.4 | 6.7 |

That is, as compared with comparative example 1, the example has the same number of elements, and has double the number of nodes. Also, as compared with comparative example 2, the example has a number of elements of about 1/4.7, and has a number of nodes of about 1/2.1. The example and comparative example 1 differ from each other only in the number of nodes (not shown), and are completely the same in the sectioning into elements. By comparing the example and comparative example 2, the number of elements differs significantly, and furthermore the number of nodes differs significantly. In comparative example 2, a large number of elements is generated by a mesh generation algorithm that is the same as that of comparative example 1, but a parameter specified to generate a mesh is changed to make the number of generated elements different. For the example and comparative examples 1 and 2, the maximum value of the aspect ratio and the maximum value of the volume ratio of the solid element contained in the face region were described.

As described above, in this computation example, the models having three kinds of meshes and nodes were prepared, and the vibration mode analysis was conducted by the computation of the finite element method. The computation result of natural frequencies (first-order to ninth-order natural frequency) determined in the vibration mode analysis were compared with the actually measured values of the natural frequency of the real club head. The comparison results are given in Table 2.

TABLE 2

Natural frequencies (Hz)

| Mode | Measured value | Example | Comparative example 1 | Comparative example 2 |
|---|---|---|---|---|
| 1 | 4250 | 4517 | 3574 | 4423 |
| 2 | 5710 | 6135 | 5013 | 5958 |
| 3 | 7910 | 8441 | 6189 | 8349 |
| 4 | 9510 | 10353 | 8204 | 10078 |
| 5 | 10400 | 11062 | 8977 | 10847 |
| 6 | 12800 | 14254 | 11401 | 13504 |
| 7 | 15900 | 16592 | 12498 | 16436 |
| 8 | 18700 | 19952 | 15583 | 19545 |
| 9 | 19800 | 21915 | 17066 | 20758 |

Furthermore, in a graph of FIG. 5, the natural frequencies determined in this manner are plotted with respect to vibration orders (modes).

As seen from Table 2 and FIG. 5, in the example, the calculated values of natural frequencies close to the actually measured values are obtained as compared with comparative example 1. Also, in comparative example 2, the calculated values are closer to the actually measured values than in comparative example 1, and the highest accuracy is obtained.

Table 3 gives time to complete the computation as a measure of computation amount.

TABLE 3

| | Example | Comparative example 1 | Comparative example 2 |
|---|---|---|---|
| Time (s) | 6 | 5 | 94 |

From the above results, it was revealed that, in the example, although a mesh having the same size as that of comparative example 1 was used, computation accuracy comparable to that of comparative example 2 can be achieved. In contrast, in comparative example 1, the computation accuracy is deteriorated, and in comparative example 2, the computation takes significantly more time. In the process of computation of comparative example 2, the computer executing the computation displayed a warning about insufficient memory capacity. From this respect as well, the computation load can be said to be high. In the example, which is the embodiment of the present invention, the computation accuracy can be improved while the practical speed or the computation load is maintained.

It is found that, as shown in this computation example, even if the number of elements is merely increased, high accuracy is not always achieved, and rather, sufficient computation accuracy and computation speed can be achieved by increasing the number of nodes without changing the number of elements.

Also, FIG. 6 shows amplitude distributions appearing on the surface of the model in the vibration mode computed by the example. From this amplitude distribution, it can be said that, in the example, the vibration analysis is conducted appropriately.

We have described the embodiment of the present invention. The present invention is not limited to the already-described embodiment or an example, and various modifications, changes, and combinations can be made based on the technical concept of the present invention.

BRIEF DESCRIPTION OF THE DRAWINGS

FIG. 4A(1) is an explanatory view showing example used in a computational example for analyzing a club head of the present invention, and FIG. 4A(2) is a schematic view showing the feature of an element used therein;

FIG. 4B(1) is an explanatory view showing comparative example 1 used in an example of computation for analyzing a club head of the present invention, and FIG. 4B(2) is a schematic view showing the feature of an element used therein;

FIG. 4C(1) is an explanatory view showing comparative example 2 used in an example of computation for analyzing a club head of the present invention, and FIG. 4C(2) is a schematic view showing the feature of an element used therein;

FIG. 6 is an isoplethic diagram representing the state of vibrations in example of a computational example for analyzing a club head of the present invention.

Figure 1:
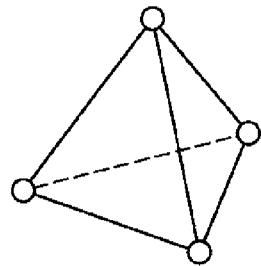
FIG. 1 is an explanatory view for explaining a conventional tetrahedral solid element.
Figure 2:
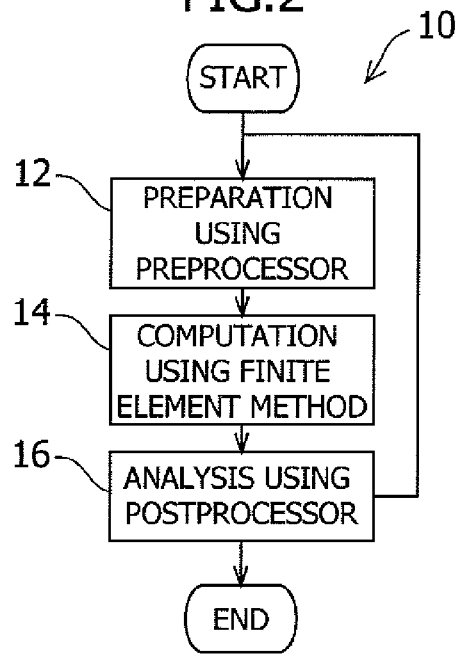
FIG. 2 is a flowchart showing a processing process of a method of analysis in accordance with the present invention.
Figure 3:
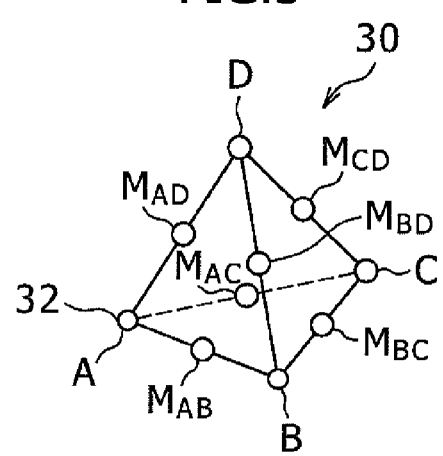
FIG. 3 is an explanatory view showing an example of a solid element used in a mode of the present invention.
Figure 5:
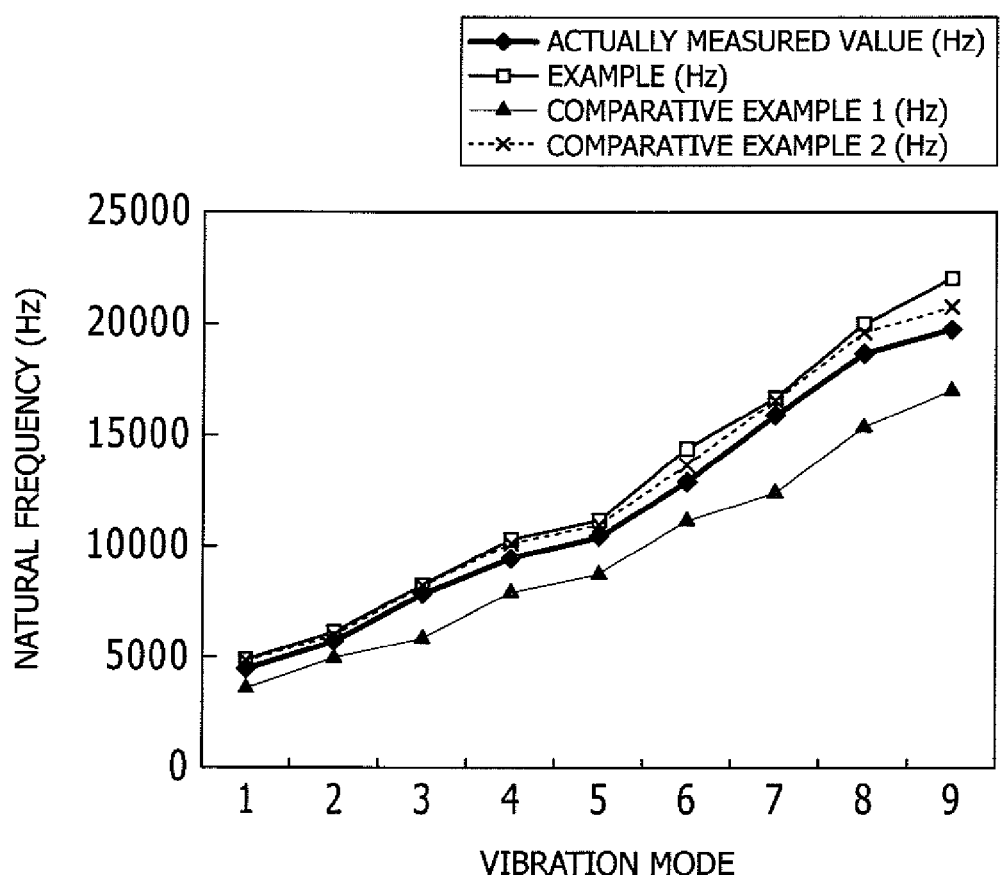
FIG. 5 is a graph showing a computation result in an example of computation for analyzing a club head of the present invention by comparing with an actual measurement result.

| Reference Numerals | |
|---|---|
| 10 | Method of Analysis |
| 30 | Solid Elements |
| 32 | Nodes |

What is claimed is:

1. A method of analysis of the kinetic properties of a golf club head, comprising the steps of:
    preparing a model of a golf club head represented by a set of elements including a tetrahedral solid element on a computer;
    providing nodes at the vertexes and on at least one side of the tetrahedral solid element between adjacent ones of the vertexes; and
    computing the kinetic properties of the golf club head by the finite element method in which the elements and nodes of the model are used and the nodes are set as output points of computation,
    wherein, in at least some of the tetrahedral solid elements, the number of nodes provided per one element is not fewer than ten.

2. The method of analysis according to claim 1, wherein the aspect ratio of the tetrahedral solid element is not lower than 1.0 and not higher than 8.0.

3. The method of analysis according to claim 1, wherein the node provided on the side is placed at the midpoint of side.

4. The method of analysis according to claim 1, wherein at least one of constituent materials or constituent parts in the model is divided into some sets, and any of the sets is represented by a set of shell elements having at least three nodes.

5. The method of analysis according to claim 1, wherein the model has an aspect ratio of tetrahedral solid element of not lower than 1.0 and not higher than 1.5 in the face region of the golf club head.

6. The method of analysis according to claim 5, wherein the aspect ratio is not lower than 1.0 and not higher than 1.35 in the face region of the golf club head.

7. The method of analysis according to claim 1, wherein the aspect ratio of the shape of each of all tetrahedral solid elements included is not lower than 1.0 and not higher than 4.5.

8. The method of analysis according to claim 5, wherein a volume ratio, which is a ratio of the maximum volume to the minimum volume of tetrahedral solid element, is not lower than 1 and not higher than 10 in the face region of the golf club head.

9. The method of analysis according to claim 8, wherein the volume ratio is not lower than 1 and not higher than 8.

10. A golf club having a golf club head analyzed or designed by using the method of analysis described in claim 1.

* * * * *